United States Patent [19]

Datta et al.

[11] Patent Number: 5,620,611
[45] Date of Patent: Apr. 15, 1997

[54] METHOD TO IMPROVE UNIFORMITY AND REDUCE EXCESS UNDERCUTS DURING CHEMICAL ETCHING IN THE MANUFACTURE OF SOLDER PADS

[75] Inventors: Madhav Datta, Westchester County; Thomas S. Kanarsky; Michael B. Pike, both of Dutchess County; Ravindra V. Shenoy, Westchester County, all of N.Y.

[73] Assignee: International Business Machines Corporation, Armonk, N.Y.

[21] Appl. No.: 659,459

[22] Filed: Jun. 6, 1996

[51] Int. Cl.$^6$ .................................................. H01L 23/48
[52] U.S. Cl. .......................... 216/13; 216/95; 216/108; 437/183; 437/192; 438/614; 438/751
[58] Field of Search .......................... 216/95, 105, 108, 216/106, 13; 437/183; 257/737, 738; 228/180.22

[56] References Cited

U.S. PATENT DOCUMENTS

| | | | |
|---|---|---|---|
| 4,787,958 | 11/1988 | Lytle | 156/652 |
| 5,248,632 | 9/1993 | Tung et al. | 437/195 |
| 5,376,584 | 12/1994 | Agarwala | 437/183 |
| 5,384,283 | 1/1995 | Gengenwarth et al. | 437/183 |
| 5,418,186 | 5/1995 | Park et al. | 437/183 |
| 5,462,638 | 10/1995 | Datta et al. | 156/656.1 |

Primary Examiner—R. Bruce Breneman
Assistant Examiner—Julie E. Stein
Attorney, Agent, or Firm—Whitham, Curtis, Whitham & McGinn

[57] ABSTRACT

Reduced undercutting of a titanium-tungsten layer in a ball limiting metallurgy (BLM) is achieved in the preparation of solder ball interconnect structures by removing metal oxide film which forms on the titanium-tungsten layer and etching the titanium-tungsten layer in different steps. Removing the metal oxide with an acid solution prior to etching the titanium-tungsten layer provides for a more uniform etch of the titanium-tungsten layer.

8 Claims, 3 Drawing Sheets

METHOD TO IMPROVE UNIFORMITY AND REDUCE EXCESS UNDERCUTS DURING CHEMICAL ETCHING IN THE MANUFACTURE OF SOLDER PADS

BACKGROUND OF THE INVENTION

1. Field of the Invention

The present invention generally relates to computer chip manufacture and, more particularly, to improving the manufacture of interconnect structures in the form of solder bumps used in "flip chip" interconnects, by removing oxide that occurs during the manufacturing process.

2. Background Description

"Flip-chip" interconnects comprise an array of solder balls deposited on metallic layers on one side of an integrated circuit (IC) chip. These structures are sometimes referred to as Controlled, Collapse, Chip Connection (C4) structures, and the solder balls are designed to mate with metallic pads on a chip carrier or substrate having metallized wiring. In the practice of the present invention, the metallic layers, called Ball Limiting Metallurgy (BLM), on which the solder balls are formed comprise layers of titanium-tungsten and phased chromium-copper/copper.

Titanium-tungsten is used as an adhesion layer which electrically contacts interconnects formed in a surface of the chip. The process steps in electrochemical fabrication of complete "flip-chip" interconnects involve:

1. Sputter deposition of seed layers (titanium-tungsten and phased chromium-copper/copper);
2. Application of photoresist and its patterning;
3. Electrodeposition of solder;
4. Stripping the photoresist;
5. Etching of the seed layers; and
6. Reflow.

The seed layer etching is a two step process that consists of first removing the copper and chromium-copper by electrochemical etching and then removing the titanium-tungsten by chemical etching. The seed layers which remain underneath the solder balls after the two step etching process forms the BLM.

The chemical etching of the titanium-tungsten is preferably performed by a hydrogen peroxide ($H_2O_2$) based etchant. The chemical etchant has to first remove an oxide film which forms on the titanium-tungsten during the electrochemical etching of the copper and chromium-copper before etching the actual titanium-tungsten metal layer. The variation in the oxide film across the wafer as well as from wafer to wafer leads to differences in the time required for removing the oxide film and initiation of the actual titanium-tungsten metal removal. Since the oxide etch rate differs from the metal etch rate, the result is non-uniform etching and wide variations in the amounts of titanium-tungsten undercuts.

The resulting cross-sectional profile of the BLM structure is critical to building a sound and robust interconnect pad. The undercut or process bias of the titanium-tungsten layer is determined during the wet chemical etch process. The resulting diameters of the copper and phased chromium-copper layer are easily measured under a microscope on test sites or partial chips. The resulting diameter of the titanium-tungsten portion of the BLM structure is not so easily measured because it is hidden by the overlaying phased chromium-copper layer. Excess titanium-tungsten undercut must be controlled by process design in order to ensure a mechanically sound BLM structure.

The titanium-tungsten seed layer of the BLM is typically on the order of 1000Å and consists of 90% tungsten and 10% titanium. Titanium-tungsten undercuts due to wet etching have been measured to be in a range from 1 micron to 9 microns relative to the phased chromium-copper layer of the BLM. The variation in the titanium-tungsten undercut is seen across the wafers as well as from wafer to wafer. Factors affecting the amount of titanium-tungsten undercut include etch solution composition, titanium-tungsten layer thickness, and amounts of etch resistant metal oxides formed on the titanium-tungsten surface.

The amount of titanium-tungsten undercut cannot be measured nondestructively. Measuring of titanium-tungsten undercut can also significantly add to the cost. Therefore, a seed layer etching process that ensures minimal titanium-tungsten undercuts (e.g., less than or equal to 1 micron) is highly desirable.

SUMMARY OF THE INVENTION

It is therefore an object of the present invention to prevent excessive undercutting of titanium-tungsten layer relative to phased chromium-copper layer in ball limiting metallurgy (BLM), particularly in the area of the interconnect pad.

According to this invention, an oxide film formed on the titanium-tungsten layer during electrochemical etching of copper and chromium-copper layers is removed prior to etching the titanium-tungsten, resulting in a uniform etch rate across the wafer surface and reducing the over-etching underneath the interconnect pad to between zero and 1 micron. The metal oxide film on the titanium-tungsten layer is removed by immersing the wafer in an acid solution immediately prior to the chemical etching of the titanium-tungsten seed layer. Because the etch rates of the oxide film and the titanium-tungsten metal are different, removal of the oxide film prior to the metal etch process has the effect of improving the metal etch uniformity both across the wafer and in the vicinity of the interconnect pad.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
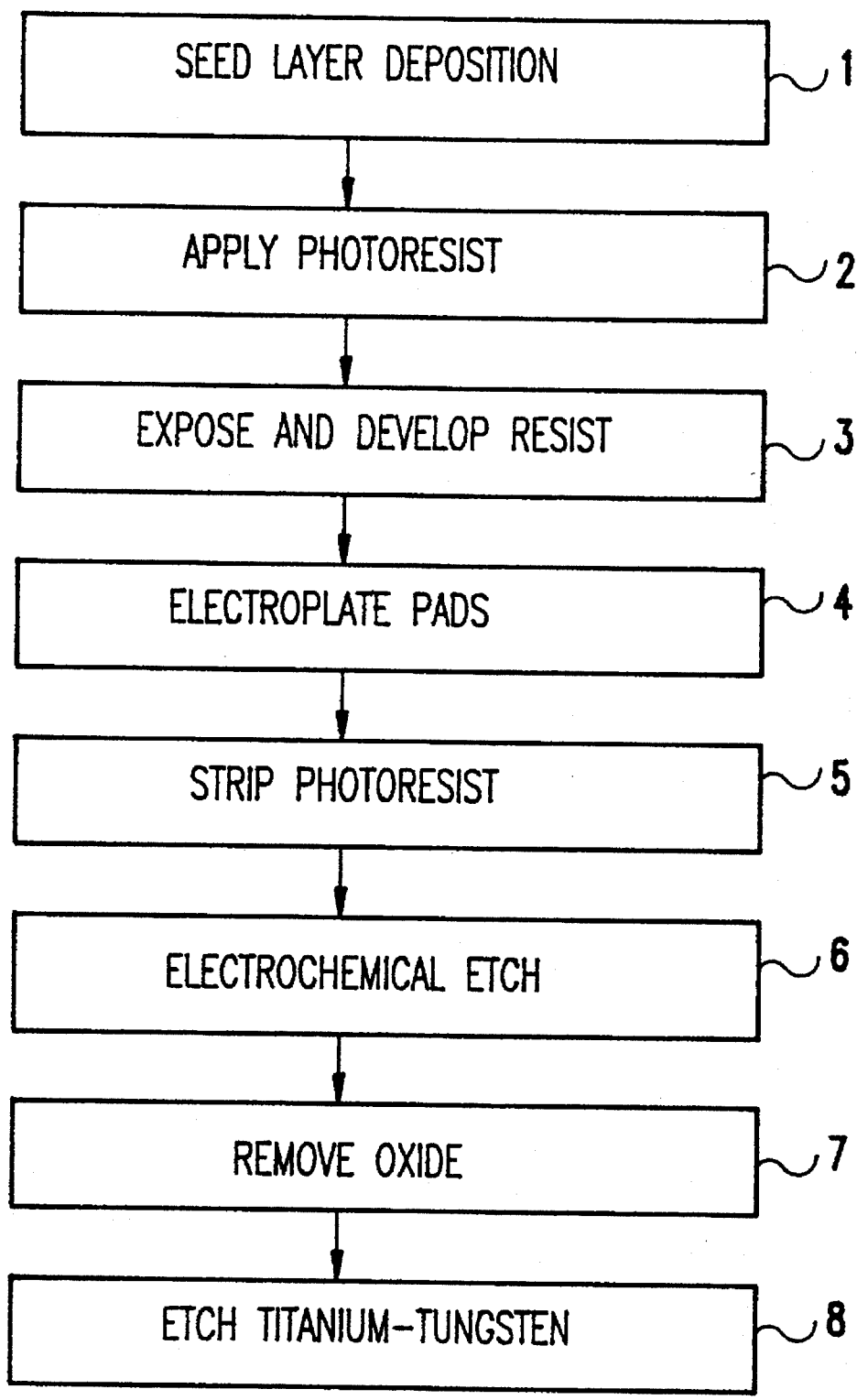
FIG. 1 is a flow chart showing the process for preparing lead-tin interconnects including the step of the present invention.

Referring now to the drawings, and more particularly to FIG. 1, there is shown a flow chart showing the process of preparing C4 structures (i.e., solder ball on BLM) interconnects, which includes the inventive step. First, as represented by block 1, seed layer deposition occurs. This includes sputter deposition of titanium-tungsten, phased chromium-copper, and copper layers. In the second step, represented by block 2, a thick photoresist is applied. In the third step, represented by block 3, resist images are exposed and developed. Then, as represented by block 4, the solder pads are electroplated. In the fifth step, as represented by block 5, the photoresist is stripped.

Figure 2:
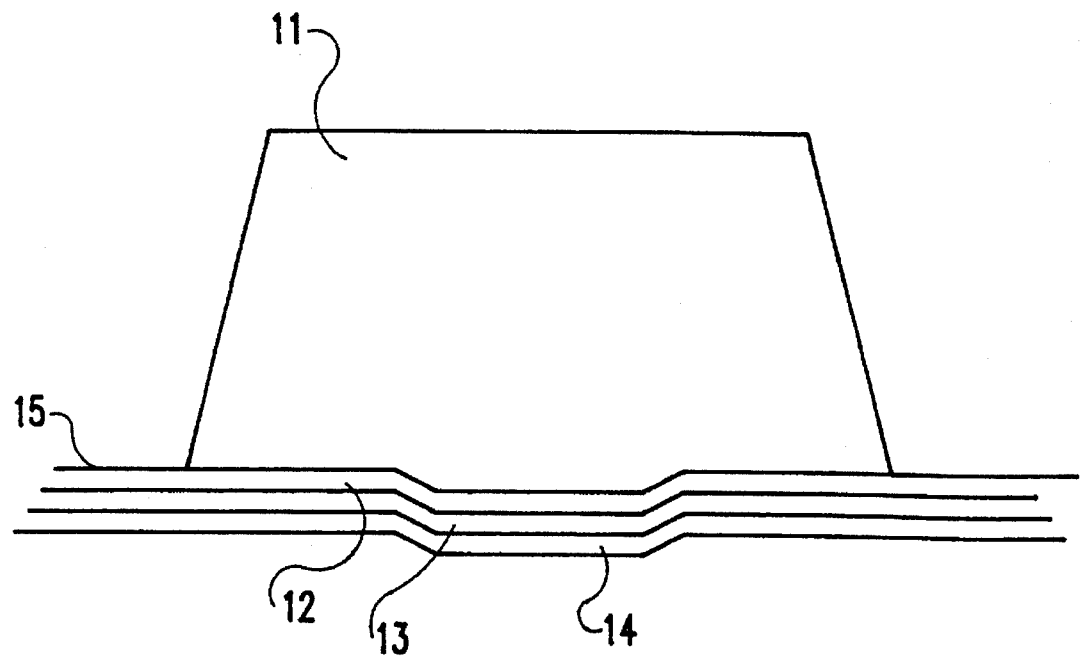
FIG. 2 is a cross-sectional view of an interconnect pad following electroplating of lead-tin pad.

FIG. 2 shows a cross-sectional view of an interconnect structure prepared after seed layers have been deposited and a solder pad has been plated. This is how the interconnect structure would look after step five of the flow chart shown in FIG. 1. As can be seen, solder pad 11 sits over sputtered copper layer 12, sputtered chromium-copper layer 13, and sputtered titanium-tungsten layer 14.

Returning to FIG. 1, in the sixth step as represented by block 6, copper and phased chromium-copper layers are removed by electrochemical etching. This step results in uneven growth of oxide on the exposed surface of the titanium-tungsten layer.

Figure 3:
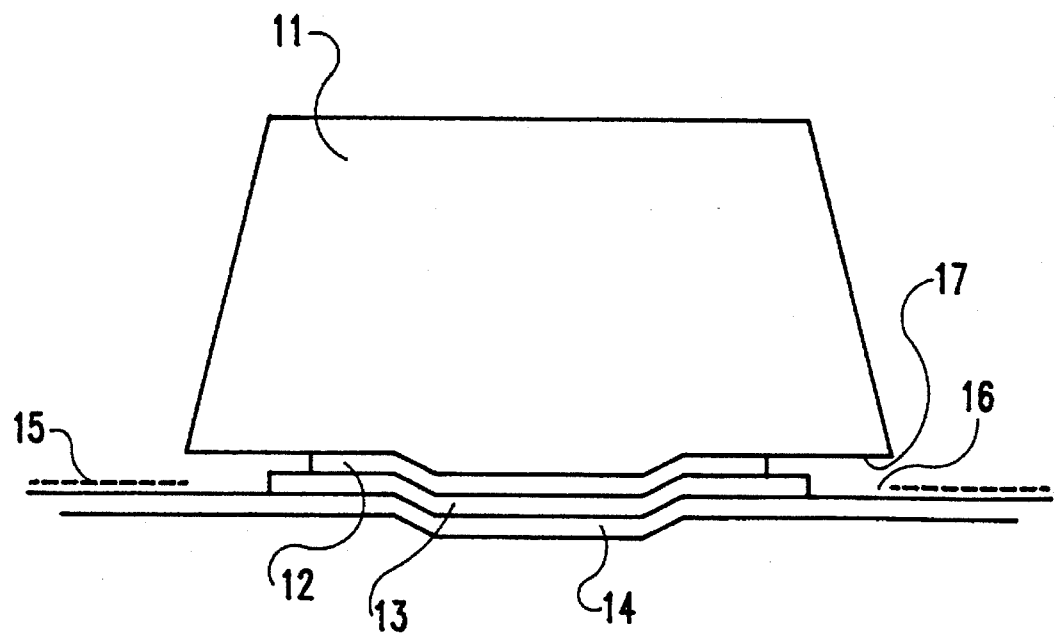
FIG. 3 is a cross-sectional view of an interconnect pad after electrochemical etching of seed layers.

FIG. 3 shows how the interconnect structure would look following the sixth processing step as described in connection with block 6 of FIG. 1.

FIG. 3 is a cross-sectional view of the interconnect structure shown in FIG. 2 after electrochemical etching of sputtered copper layer 12 and sputtered chromium-copper layer 13. The electrochemical etch process creates an overhang 17 of the solder pad 11 over the titanium-tungsten layer 14 by undercutting the copper and chromium-copper layers 12 and 13. As a result of the electrochemical etching, an oxide film 15 forms over at least a portion of the titanium-tungsten layer 14. The oxide film is thin or missing on the portion 16 of the titanium-tungsten layer which is under the overhang 17 of the solder pad 11. The oxides are mostly tungsten oxides due to the composition of the underlying metal layer.

Returning to FIG. 1, the next step, as represented by block 7, is to remove the oxide that forms on the titanium-tungsten layer with an acid solution. Immersion in the acid solution removes the metal oxide on the surface of the exposed titanium-tungsten layer formed during electrochemical etching and thus reduces the amount of undercutting which occurs during etching of the titanium-tungsten layer 14. Suitable acids which may be used to remove the oxide include methane sulfonic acid (MSA) and sulfuric acid ($H_2SO_4$). Finally, as represented by block 8, the titanium-tungsten is removed by a conventional wet etch.

Figure 4:
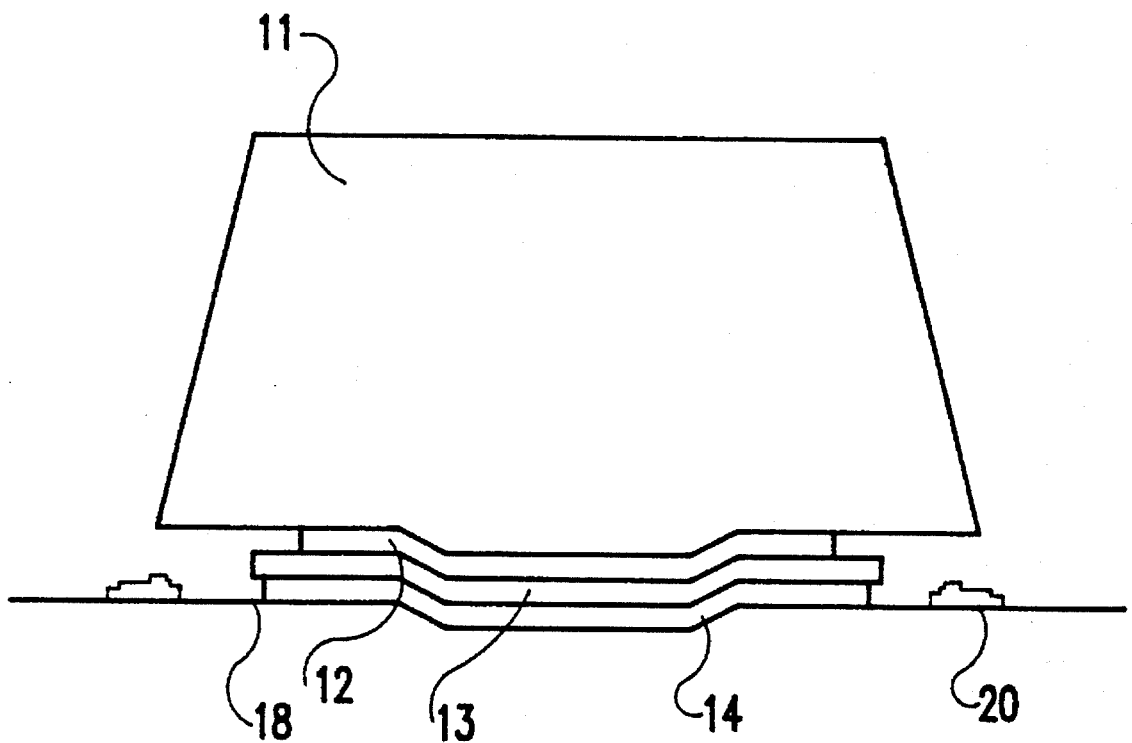
FIG. 4 is a cross-sectional view of an interconnect pad after completion of the process, including the inventive step.

FIG. 4 shows a cross-sectional view of the interconnect structure after the final step of the process as it is in block 8 of FIG. 1. Following wet etching of the titanium-tungsten layer 14, a small undercut 18 of the titanium-tungsten appears beneath the sputtered chromium-copper layer 13. This undercut typically measures between zero and 1 micron. Without the inventive step of removing the oxide from the titanium-tungsten layer before etching the titanium-tungsten layer, the undercut would measure as much as 10 microns. The wet etching step does leave some detached titanium-tungsten in the form of ring 20. The titanium-tungsten ring does not have any effect on the structure and does not need to be removed.

In practice, another source of variation in the oxide that forms on the titanium-tungsten layer producing wafer to wafer variation has been observed due to time delays between the copper/chromium-copper electrochemical etching step and the titanium-tungsten chemical etching step. Excessive delay between the two etching steps with the titanium-tungsten metal layer exposed to ambient conditions leads to further growth of oxide film and can contribute to wafer to wafer variation. This is the same oxide formed during electrochemical etching. Because the oxide is the same, the oxide removal step permits an excessive delay between two etching steps. The inventive step of removing oxide from the titanium-tungsten layer should be performed just prior to titanium-tungsten etch in order to avoid the formation of another oxide film on the titanium-tungsten layer.

This invention separates the step of removal of oxide from the titanium-tungsten layer and the step of etching the titanium-tungsten layer such that the oxide removal step does not etch any titanium-tungsten metal. This involves the removal of the oxide on top of the titanium-tungsten layer first immediately followed by etching of the titanium-tungsten metal layer. The oxide removal is carried out in a solution that is compatible with the different metals and dielectrics present on the interconnect wafers and which can effectively remove the oxide films. These materials include copper, chromium-copper, titanium-tungsten, lead-tin (solder), aluminum-0.5% copper, polyimide, silicon oxide and silicon nitride. The preferred solutions are acidic solutions of $H_2SO_4$ and MSA. The preferred concentrations of the solutions are about 1% to about 30% $H_2SO_4$ and about 3N to about 4N MSA. The concentration of the acid solution simply affects the speed with which the oxide is removed. Using a higher concentration of acid will result is faster oxide removal. This process does not attack any of the metals or the dielectric materials and is effective in removing the oxide film on top of the titanium-tungsten layer. The oxide removal is then immediately followed by etching of the titanium-tungsten layer by, e.g., a $H_2O_2$ based etchant.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of improving uniformity and reducing excess undercuts in the manufacture of solder pad interconnects comprising the steps of:

providing a substrate having a layer of ball limiting metallurgy, at least a portion of said layer having a metal oxide film thereon; and removing said metal oxide film with an acid solution prior to etching selected portions of the layer.

2. The method of improving uniformity and reducing excess undercuts in the manufacture of solder pad interconnects as recited in claim 1 wherein said acid solution is selected from the group consisting of sulfuric acid solutions and methane sulfonic acid solutions.

3. The method of improving uniformity and reducing excess undercuts in the manufacture of solder pad interconnects as recited in claim 1 further comprising the step of etching said ball limiting metallurgy, wherein the etching step is performed immediately after the step of removing said metal oxide film.

4. The method of improving uniformity and reducing excess undercuts in the manufacture of solder pad interconnects as recited in claim 3 wherein the step of etching of said ball limiting metallurgy is performed with a hydrogen peroxide based etchant.

5. A method of improving uniformity and reducing excess undercuts in the manufacture of solder pad interconnects comprising the steps of:

sputter depositing a seed layer of a first metal;

depositing at least a second metal layer on said seed layer;

depositing solder onto said second metal layer;

electrochemical etching said second metal layer;

removing with an acid solution a metal oxide film formed on surfaces of said seed layer exposed during said electrochemical etching of said second metal layer; and etching said seed layer with an etchant different than said acid solution.

6. The method of improving uniformity and reducing excess undercuts in the manufacture of solder pad interconnects as recited in claim 5 wherein said acid solution is selected from the group consisting of sulfuric acid solutions and methane sulfonic acid solutions.

7. The method of improving uniformity and reducing excess undercuts in the manufacture of solder pad interconnects as recited in claim 5 wherein there is an delay between the steps of electrochemical etching and removing the metal oxide film.

8. The method of improving uniformity and reducing excess undercuts in the manufacture of solder pad interconnects as recited in claim 5 wherein etching of said seed layer is performed with a hydrogen peroxide based etchant.

\* \* \* \* \*